(12) United States Patent
Morita et al.

(10) Patent No.: US 11,382,218 B2
(45) Date of Patent: Jul. 5, 2022

(54) PRINTED WIRING BOARD AND METHOD FOR MANUFACTURING THE SAME

(71) Applicant: TDK CORPORATION, Tokyo (JP)

(72) Inventors: Takaaki Morita, Tokyo (JP); Seiichi Tajima, Tokyo (JP); Takashi Kariya, Tokyo (JP)

(73) Assignee: TDK CORPORATION, Tokyo (JP)

( * ) Notice: Subject to any disclaimer, the term of this patent is extended or adjusted under 35 U.S.C. 154(b) by 0 days.

(21) Appl. No.: 16/421,547

(22) Filed: May 24, 2019

(65) Prior Publication Data

US 2019/0373742 A1 Dec. 5, 2019

(30) Foreign Application Priority Data

May 29, 2018 (JP) .............................. JP2018-102156

(51) Int. Cl.
| | |
|---|---|
| *H05K 1/00* | (2006.01) |
| *H05K 1/02* | (2006.01) |
| *H05K 1/03* | (2006.01) |
| *H05K 1/09* | (2006.01) |
| *H05K 1/11* | (2006.01) |
| *H05K 3/00* | (2006.01) |
| *H05K 3/10* | (2006.01) |
| *H05K 3/46* | (2006.01) |
| *H01L 21/02* | (2006.01) |
| *H01L 21/48* | (2006.01) |
| *H01L 21/56* | (2006.01) |
| *H01L 23/34* | (2006.01) |
| *H01L 23/52* | (2006.01) |

(Continued)

(52) U.S. Cl.
CPC ......... *H05K 3/4626* (2013.01); *H05K 3/4069* (2013.01); *H05K 3/4614* (2013.01); *H05K 3/4623* (2013.01); *H05K 3/4655* (2013.01); *H05K 2201/0141* (2013.01); *H05K 2201/09209* (2013.01); *H05K 2203/1189* (2013.01)

(58) Field of Classification Search
CPC .. H05K 1/00; H05K 1/02; H05K 1/03; H05K 3/00; H05K 3/10; H05K 3/46; H05K 1/09; H05K 1/11; H01L 21/02; H01L 21/48; H01L 21/56; H01L 23/34; H01L 23/52; H01L 23/495
USPC ................ 174/251, 252, 262, 265, 254–260; 257/668, 698, 774, 723; 156/272.2, 156/275.7, 288, 309.6; 361/782
See application file for complete search history.

(56) References Cited

U.S. PATENT DOCUMENTS

| | | | | |
|---|---|---|---|---|
| 4,983,713 A | * | 1/1991 | Hayashi | ............. C09K 19/3809 528/190 |
| 5,440,805 A | | 8/1995 | Daigle et al. | |

(Continued)

FOREIGN PATENT DOCUMENTS

| | | |
|---|---|---|
| JP | H7-170069 A | 7/1995 |
| JP | H8-097565 A | 4/1996 |

(Continued)

*Primary Examiner* — Xiaoliang Chen
(74) *Attorney, Agent, or Firm* — Oliff PLC

(57) ABSTRACT

In a printed wiring board, when a plurality of wiring base bodies are collectively stacked, a constituent material of a first layer of an insulating resin film has a low melting point, so that the first layer is easily melted. Therefore, thermal welding on an upper surface of the wiring base body is reliably performed, and the wiring base bodies are bonded to each other with high reliability.

3 Claims, 7 Drawing Sheets

(51) Int. Cl.
*H01L 23/495* (2006.01)
*H05K 3/40* (2006.01)

(56) References Cited

U.S. PATENT DOCUMENTS

| | | | | |
|---|---|---|---|---|
| 5,632,945 A | * | 5/1997 | Sasaki | B29B 13/023 |
| | | | | 264/210.2 |
| 5,719,354 A | * | 2/1998 | Jester | H05K 3/4617 |
| | | | | 174/255 |
| 5,744,758 A | * | 4/1998 | Takenouchi | H05K 3/4617 |
| | | | | 174/255 |
| 6,010,760 A | * | 1/2000 | Miyazaki | B29C 45/0001 |
| | | | | 428/36.92 |
| 6,440,542 B1 | * | 8/2002 | Kariya | H05K 3/0035 |
| | | | | 174/259 |
| 6,889,433 B1 | * | 5/2005 | Enomoto | H05K 3/4069 |
| | | | | 29/825 |
| 2002/0039438 A1 | * | 4/2002 | Mori | G06T 7/32 |
| | | | | 382/154 |
| 2002/0157864 A1 | * | 10/2002 | Koyama | H05K 1/036 |
| | | | | 174/261 |
| 2004/0040651 A1 | * | 3/2004 | Tsugaru | H05K 3/4617 |
| | | | | 156/272.2 |
| 2004/0126547 A1 | * | 7/2004 | Coomer | H01L 21/4857 |
| | | | | 428/209 |
| 2006/0278963 A1 | * | 12/2006 | Harada | H05K 3/4688 |
| | | | | 257/668 |
| 2007/0228535 A1 | * | 10/2007 | Fujino | H01S 5/02244 |
| | | | | 257/678 |
| 2008/0153976 A1 | * | 6/2008 | Akatsuka | C08L 63/00 |
| | | | | 524/611 |
| 2009/0065240 A1 | * | 3/2009 | Onodera | B32B 27/36 |
| | | | | 174/252 |
| 2009/0107624 A1 | * | 4/2009 | Tsugaru | H05K 3/4617 |
| | | | | 156/272.2 |
| 2010/0212937 A1 | * | 8/2010 | Kondo | H05K 3/4617 |
| | | | | 174/254 |
| 2011/0244636 A1 | * | 10/2011 | Kondo | H01L 23/49822 |
| | | | | 438/127 |
| 2011/0262762 A1 | * | 10/2011 | Sekine | H01L 21/76898 |
| | | | | 428/548 |
| 2011/0266666 A1 | * | 11/2011 | Maeda | H01L 24/19 |
| | | | | 257/698 |
| 2011/0297431 A1 | * | 12/2011 | Yamada | H05K 3/4015 |
| | | | | 174/258 |
| 2012/0132458 A1 | * | 5/2012 | Sekine | H05K 1/0393 |
| | | | | 174/254 |
| 2013/0048345 A1 | * | 2/2013 | Masuda | H05K 3/4626 |
| | | | | 174/251 |
| 2013/0062101 A1 | | 3/2013 | Kanai et al. | |
| 2014/0328038 A1 | * | 11/2014 | Kato | H01L 24/19 |
| | | | | 361/761 |
| 2014/0378803 A1 | * | 12/2014 | Geistert | A61M 25/0067 |
| | | | | 156/218 |
| 2015/0305150 A1 | | 10/2015 | Ohata | |
| 2016/0086732 A1 | * | 3/2016 | Kishida | H01G 4/1209 |
| | | | | 361/301.4 |
| 2016/0150647 A1 | * | 5/2016 | Bohra | H05K 1/0298 |
| | | | | 361/736 |
| 2016/0295707 A1 | * | 10/2016 | Takano | H05K 1/092 |
| 2017/0229367 A1 | * | 8/2017 | Ge | H01L 21/76264 |
| 2018/0226438 A1 | * | 8/2018 | Liu | H01L 27/1288 |

FOREIGN PATENT DOCUMENTS

| | | |
|---|---|---|
| JP | 2004-111942 A | 4/2004 |
| WO | 2011/155162 A1 | 12/2011 |
| WO | 2014/109139 A1 | 7/2014 |

\* cited by examiner

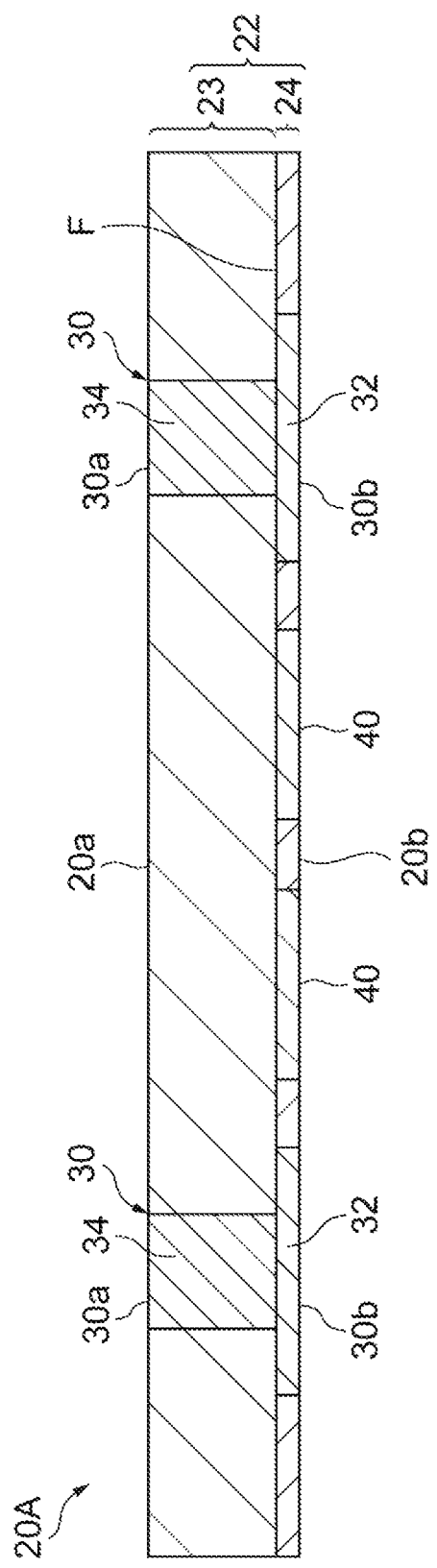

PRINTED WIRING BOARD AND METHOD FOR MANUFACTURING THE SAME

CROSS-REFERENCE TO RELATED APPLICATIONS

This application is based upon and claims the benefit of priority from Japanese Patent Application No. 2018-102156, filed on 29 May 2018, the entire contents of which are incorporated herein by reference.

TECHNICAL FIELD

The present disclosure relates to a printed wiring board and a method for manufacturing the same.

BACKGROUND

In the related art, printed wiring boards having a multi-layer structure, in which a plurality of wiring base bodies are stacked, are known. For example, PCT International Publication No. WO2011/155162 (Patent Literature 1) and PCT International Publication No. WO2014/109139 (Patent Literature 2) disclose configurations in which a wiring formed on a main surface of each of wiring base bodies is connected through a conductive post extending in a thickness direction of the base bodies. In addition, Japanese Unexamined Patent Publication No. 2004-111942 (Patent Literature 3) is known.

SUMMARY

In a printed wiring board according to Patent Literature 1, a region, in which a wiring is formed, is locally increased in thickness. Therefore, when a printed wiring board is constituted by stacking a plurality of wiring base bodies using a technique such as random stacking or collective stacking, unevenness is likely to be generated on the front surface of the printed wiring board, so that it is difficult to achieve high flatness. In order to improve flatness of printed wiring boards, for example, Patent Literature 2 proposes a technology in which a part of a main surface region is coated with a thermoplastic resin before collective stacking. However, problems such as complexity of the steps thereof still remain.

Therefore, the inventors have repeated researches on flattening of printed wiring boards and have ascertained that when a wiring and a conductive post for interlayer connection are embedded in a wiring base body instead of forming a wiring on a main surface of a wiring base body, increase in thickness of a region of the conductive post is curbed so that the wiring base body can be improved in flatness as a result. According to such a configuration, it is also possible to improve flatness of printed wiring boards in which a plurality of layers are stacked by a technique such as collective stacking, and stability in interlayer connection.

The inventors have further repeated research on a technology in which a wiring is embedded in a wiring base body and have newly found a technology which can enhance bonding reliability when constituting a printed wiring board by stacking a plurality of wiring base bodies.

According the present disclosure, a printed wiring board improved in bonding reliability and a method for manufacturing the same are provided.

According to an embodiment of the present disclosure, there is provided a printed wiring board including at least one layer of a wiring base body including an insulating resin film having a first main surface and a second main surface; a conductive post embedded in the insulating resin film and the conductive post penetrating the insulating resin film from the first main surface to the second main surface; and a wiring embedded in the insulating resin film, the wiring extending in a direction parallel to the second main surface, and the wiring exposed to the second main surface. The insulating resin film has a multi-layer structure including a first layer constituting the first main surface and a second layer constituting the second main surface. A melting point of a constituent material of the first layer is lower than a melting point of a constituent material of the second layer.

In the printed wiring board, a plurality of wiring base bodies can be stacked by being collectively stacked at a high temperature. In this case, the constituent material of the first layer has a low melting point, so that the first layer is easily melted. Therefore, thermal welding on the first main surface of the wiring base body can be reliably performed, and the wiring base bodies can be bonded to each other with high reliability. On the other hand, the constituent material of the second layer has a relatively high melting point, so that the second layer is unlikely to be melted during collective stacking. Therefore, strains, peeling, and the like of the wiring exposed to the second main surface constituted in the second layer can be curbed.

In the printed wiring board according to the embodiment, the conductive post may have a wiring portion exposed to the second main surface and a main body portion extending from the wiring portion to the first main surface.

In the printed wiring board according to the embodiment, the wiring portion and the main body portion of the conductive post may be constituted through plating.

According to another embodiment of the present disclosure, there is provided a method for manufacturing a printed wiring board including at least one layer of a wiring base body including an insulating resin film having a first main surface and a second main surface; a conductive post embedded in the insulating resin film and the conductive post penetrating the insulating resin film from the first main surface to the second main surface; and a wiring embedded in the insulating resin film, the wiring extending in a direction parallel to the second main surface, and the wiring exposed to the second main surface. The method for manufacturing a printed wiring board includes the steps of forming the conductive post and the wiring on one surface of a support plate, forming the insulating resin film integrally covering the conductive post and the wiring provided on the one surface of the support plate, removing the support plate from the insulating resin film and obtaining the wiring base body, and collectively stacking a plurality of wiring base bodies and causing the wiring base bodies to be thermally welded to each other. The insulating resin film has a multi-layer structure including a first layer constituting the first main surface and a second layer constituting the second main surface. A melting point of a constituent material of the first layer is lower than a melting point of a constituent material of the second layer.

In the method for manufacturing a printed wiring board, when a plurality of wiring base bodies are collectively stacked, the constituent material of the first layer has a low melting point, so that the first layer is easily melted. Therefore, thermal welding on the first main surfaces of the wiring base bodies is reliably performed, and the wiring base bodies are bonded to each other with high reliability. On the other hand, the constituent material of the second layer has a relatively high melting point, so that the second layer is unlikely to be melted during collective stacking. Therefore, strains, peeling, and the like of the wiring exposed to the second main surface constituted in the second layer can be curbed. The step of collectively stacking a plurality of wiring base bodies may be performed at a stacking temperature within a range from a temperature near the melting point of the first layer to the melting point of the second layer. In this case, high adhesion reliability and an effect of maintaining the shape of the wiring can be achieved. As an example, when the melting point of the first layer is 280° C. and the melting point of the second layer is 310° C., the stacking temperature may be within a range of 270° C. to 300° C.

In the printed wiring board according to the embodiment, the conductive post may have a wiring portion exposed to the second main surface and a main body portion extending from the wiring portion to the first main surface. The step of forming the conductive post may include a step of forming the wiring portion on the one surface of the support plate, and a step of forming the main body portion on the wiring portion.

In the printed wiring board according to the embodiment, the wiring portion and the main body portion may be formed through plating.

BRIEF DESCRIPTION OF THE DRAWINGS

FIG. 5 is a schematic cross-sectional view illustrating a wiring base body in a different form.

DETAILED DESCRIPTION

Hereinafter, various embodiments will be described in detail with reference to the drawings. The same reference signs are applied to parts which are the same or corresponding in each of the drawings, and duplicated description will be omitted.

Figure 1:
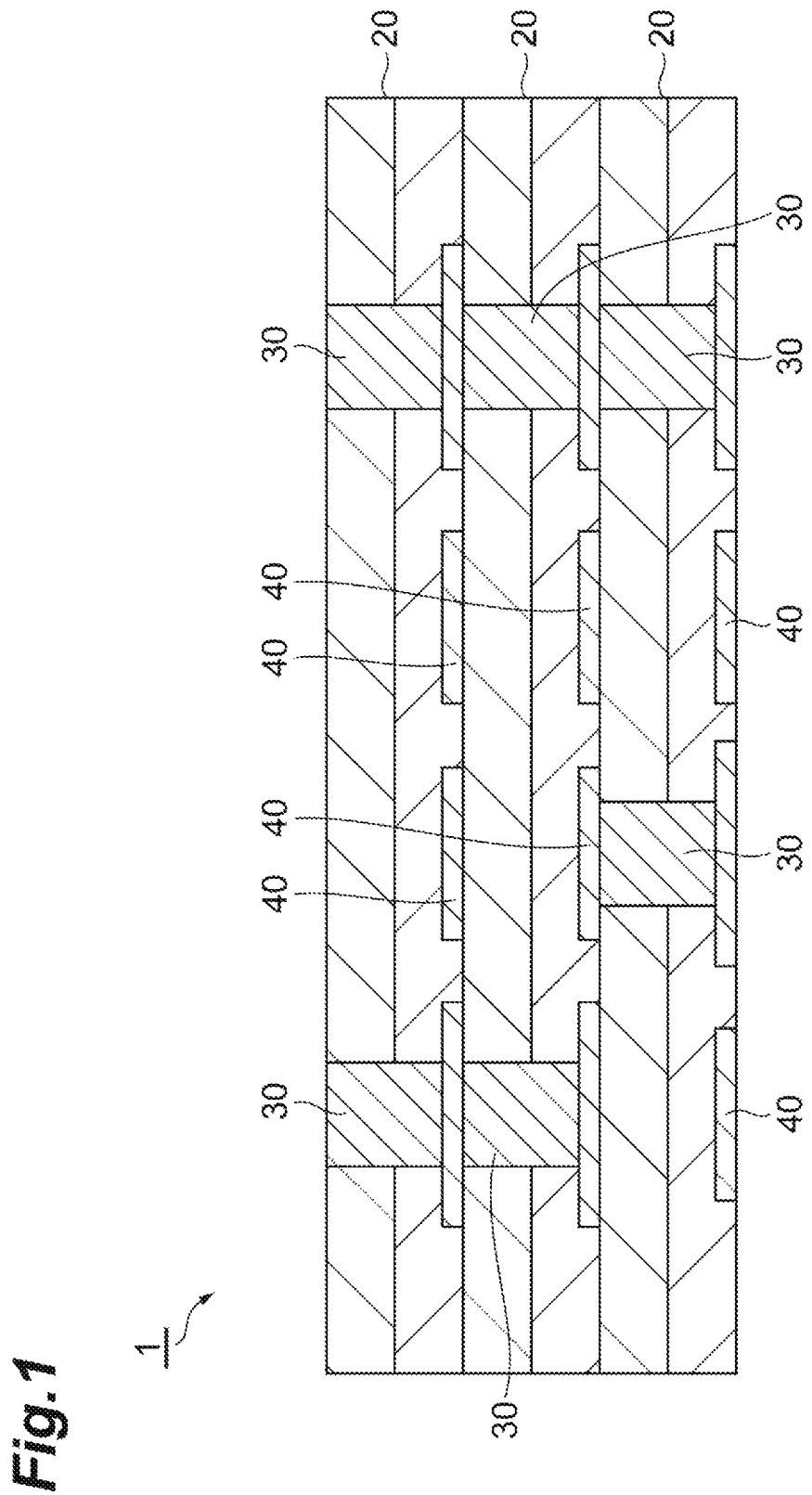
FIG. 1 is a schematic cross-sectional view illustrating a printed wiring board according to an embodiment of the present disclosure.

As illustrated in FIG. 1, a printed wiring board 1 according to the embodiment has a configuration in which a plurality of wiring base bodies 20 are stacked. In the present embodiment, the printed wiring board 1 including three wiring base bodies 20 will be described.

Figure 2:
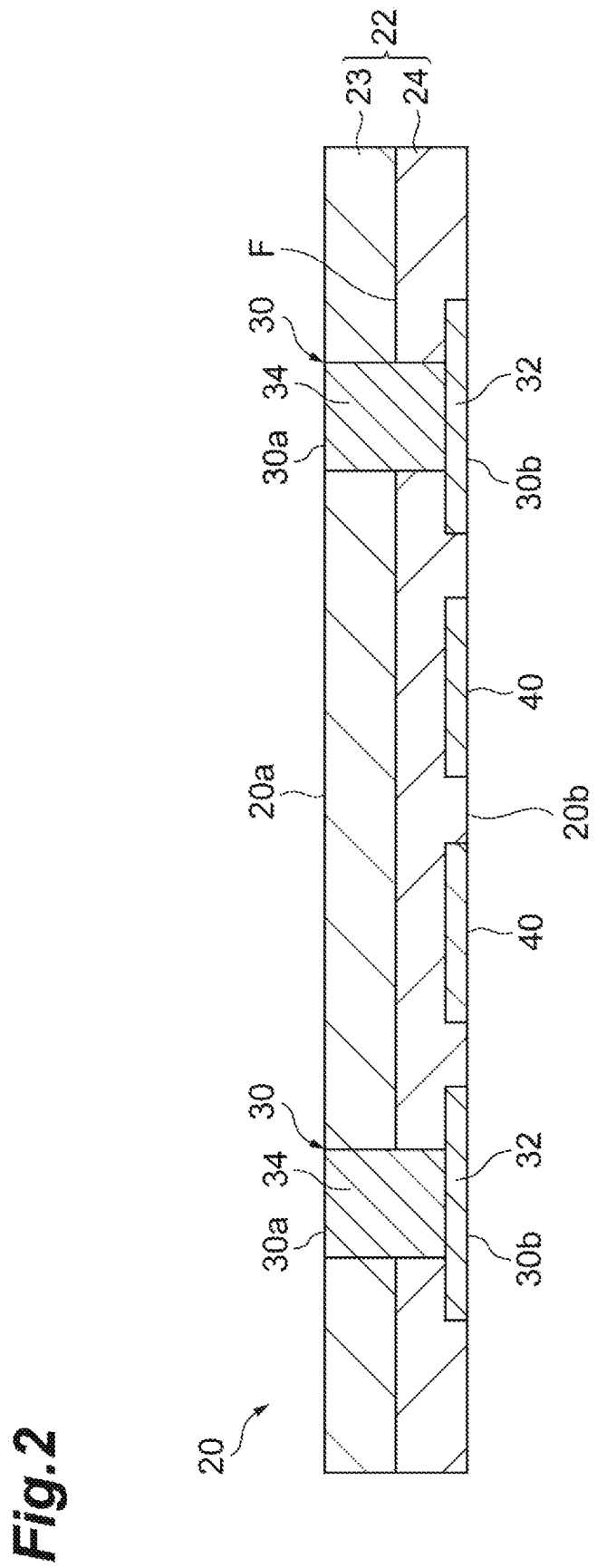
FIG. 2 is a schematic cross-sectional view illustrating a wiring base body illustrated in FIG. 1.

As illustrated in FIGS. 1 and 2, the wiring base body 20 has a thin film-like outer shape with a substantially uniform thickness. The wiring base body 20 includes an insulating resin film 22, and a conductive post 30 and a wiring 40 which are embedded in the insulating resin film 22.

The insulating resin film 22 is a thin film-like member having an upper surface 20a (first main surface) and a lower surface 20b (second main surface). The insulating resin film 22 has a multi-layer structure as illustrated in FIG. 2. In the present embodiment, the insulating resin film 22 has a two-layer structure and is configured to have a first layer 23 constituting the upper surface 20a and a second layer 24 constituting the lower surface 20b.

Both the first layer 23 and the second layer 24 of the insulating resin film 22 are formed of a thermoplastic resin. In the present embodiment, the first layer 23 and the second layer 24 are formed of a liquid crystal polymer (LCP). However, the composition of a liquid crystal polymer forming the first layer 23 and the composition of a liquid crystal polymer forming the second layer 24 differ from each other. The first layer 23 is designed to have a melting point lower than the melting point of the second layer 24.

The insulating resin film 22 is divided into the first layer 23 and the second layer 24 at a position in the substantially middle in a thickness direction thereof. A boundary surface F between the first layer 23 and the second layer 24 is at a height position of a main body portion 34 of the conductive post 30, which will be described below.

The conductive post 30 is formed of a conductive material. In the present embodiment, the conductive post 30 is formed of Cu. The conductive post 30 extends in the thickness direction of the wiring base body 20, penetrates the wiring base body 20, and includes a wiring portion 32 and the main body portion 34. The height of the conductive post 30 (length in the thickness direction of the wiring base body 20) is within a range of approximately 30 to 100 μm and is 50 μm, for example. In the present embodiment, the wiring portion 32 and the main body portion 34 are constituted as separate bodies. However, the wiring portion 32 and the main body portion 34 may be integrally constituted.

The wiring portion 32 is a flat plate-like thin piece part extending while being parallel to the lower surface 20b of the insulating resin film 22. The wiring portion 32 has a substantially uniform thickness. The thickness of the wiring portion 32 is 10 μm, for example. The lower surface of the wiring portion 32 constitutes a lower surface 30b of the conductive post 30, and the lower surface 30b of the conductive post 30 is parallel to and flush with the lower surface 20b of the wiring base body 20. The upper surface of the wiring portion 32 extends while being parallel to the lower surface 30b of the conductive post 30 and the lower surface 20b of the wiring base body 20.

The main body portion 34 is a columnar part extending upward from the wiring portion 32 to the upper surface 20a. In the present embodiment, the main body portion 34 has a shape with a circular cross section orthogonal to an extending direction thereof (that is, the thickness direction of the wiring base body 20). The main body portion 34 is designed to have a uniform diameter in the extending direction of the main body portion 34. The upper surface of the main body portion 34 constitutes an upper surface 30a of the conductive post 30. The upper surface 30a of the conductive post 30 is parallel to and flush with the upper surface 20a of the wiring base body 20.

The wiring 40 is formed of the same conductive material as the conductive post 30. In the present embodiment, the wiring 40 is formed of Cu. The wiring 40 has a substantially rectangular cross section. The wiring 40 is formed on the lower surface 20b side of the wiring base body 20 but is not formed on the upper surface 20a side. The wiring 40 extends while being parallel to the lower surface 20b of the insulating resin film 22 and is exposed to the lower surface 20b. The lower surface of the wiring 40 is parallel to and flush with the lower surface 20b of the wiring base body 20. The upper surface of the wiring 40 extends while being parallel to the lower surface of the wiring 40 and the lower surface 20b of the wiring base body 20. The wiring 40 has a substantially uniform thickness. The thickness of the wiring 40 is the same as the thickness of the wiring portion 32 of the conductive post 30 and is 10 μm, for example. The wiring 40 forms a part of a circuit of the wiring base body 20 on the lower surface 20b side.

Subsequently, a method for manufacturing the foregoing printed wiring board 1 will be described with reference to FIGS. 3A to 3D and 4A to 4C.

Figure 3A:
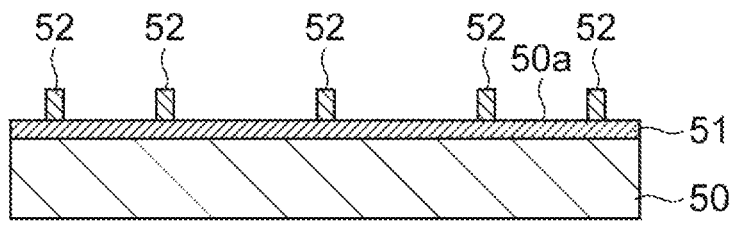
FIGS. 3A to 3D are views illustrating steps of a method for manufacturing the printed wiring board illustrated in FIG. 1.

In order to manufacture the printed wiring board 1, there is a need to manufacture the wiring base body 20. When the wiring base body 20 is manufactured, first, as illustrated in FIG. 3A, a support plate 50 in which a conducting film 51 is provided on one main surface 50a side is prepared. The support plate 50 has a flat plate shape. The support plate 50 can be formed of a prepreg material, a glass, or a silicon, for example. The conducting film 51 is a film functioning as a plating seed and can be formed of a metal such as Cu, for example. The conducting film 51 may be a metal film deposited through sputtering or the like or may be a metal foil such as a Cu foil. Alternatively, an ultrathin copper foil with a carrier or the like may be used to serve as both a part of the support plate 50 and the conducting film 51. Then, the conductive post 30 and the wiring 40 described above are formed on the main surface 50a of the support plate 50. Specifically, alongside the steps illustrated in FIGS. 3A to 3D, the conductive post 30 and the wiring 40 are plated on the main surface 50a of the support plate 50.

In the step illustrated in FIG. 3A, a resist 52 is patterned on the main surface 50a of the support plate 50. The resist 52 has openings in a region of the wiring portion 32 of the conductive post 30 described above and a region of the wiring 40.

Figure 3B:
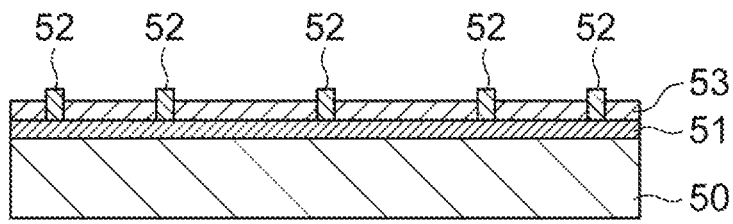

In the step illustrated in FIG. 3B, the resist 52 is used for forming a first plated layer 53 through electroplating of Cu, in which the conducting film 51 serves as a seed. Thereafter, in the step illustrated in FIG. 3C, the resist 52 is removed. The first plated layer 53 becomes the wiring portion 32 of the conductive post 30 and the wiring 40.

Figure 3C:
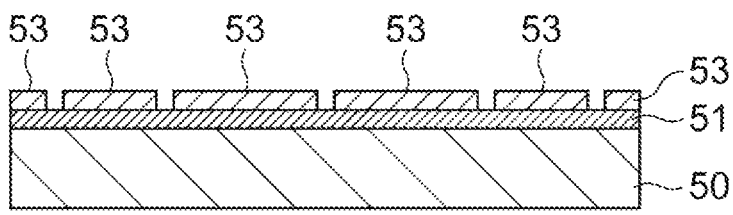
Figure 3D:
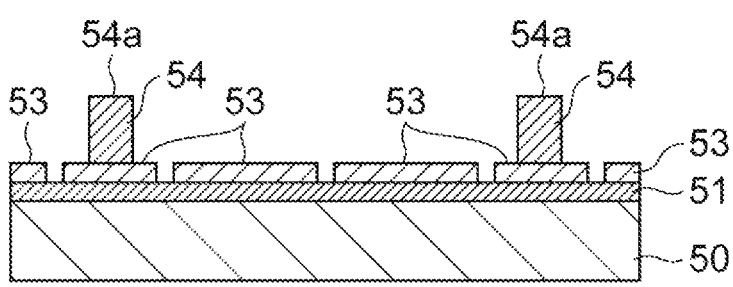

In the step illustrated in FIG. 3D, a second plated layer 54 is formed through electroplating of Cu in steps similar to the steps illustrated in FIGS. 3A to 3C (that is, resist patterning, electroplating, and resist removing). The present embodiment illustrates a procedure in which the resist 52 is removed after the first plated layer 53 is formed and before the second plated layer 54 is formed. However, the resist 52 may be removed at the same time when removing a resist used when the second plated layer 54 is formed. The second plated layer 54 is selectively formed on only the first plated layer 53 which becomes the wiring portion 32 of the conductive post 30. The second plated layer 54 becomes the main body portion 34 of the conductive post 30. After the second plated layer 54 is formed, a layer (a Cr layer, a Ti layer, or the like) for preventing oxidation of Cu can be formed on the front surfaces of the first plated layer 53 and the second plated layer 54, particularly on a top surface 54a of the second plated layer 54.

Subsequently, the insulating resin film 22 integrally covering the conductive post 30 and the wiring 40 provided on the main surface 50a of the support plate 50 is formed. Specifically, alongside the steps illustrated in FIGS. 4A to 4C, the insulating resin film 22 is formed.

Figure 4A:
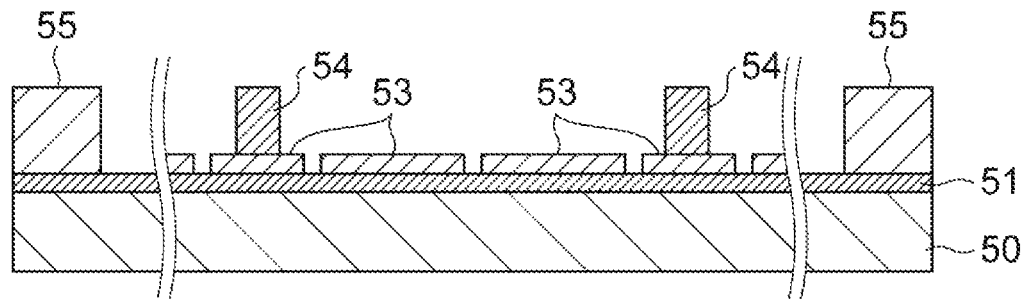
FIG. 4A to 4C are other views illustrating steps of the method for manufacturing the printed wiring board illustrated in FIG. 1.

In the step illustrated in FIG. 4A, before forming the insulating resin film 22, a frame 55 surrounding a region, in which the insulating resin film 22 is formed, is provided. For example, in the steps of forming the first plated layer 53 and the second plated layer 54, the frame 55 constituted through plating can be formed on the main surface 50a of the support plate 50 by patterning a resist having an opening corresponding to the shape of the frame 55. In addition, a separately prepared member may be disposed as the frame 55 on the main surface 50a of the support plate 50. In the step of forming the insulating resin film 22, the frame 55 can curb the material of the insulating resin film 22 flowing out of the region and can prevent excessive pressing which may cause a situation of being thinner than a desired thickness. Therefore, the frame 55 is useful for controlling the thickness of the insulating resin film 22. When the frame 55 is formed through plating in the procedure described above, the height position of the upper surface of the second plated layer 54 and the height position of the upper surface of the frame 55 easily coincide with each other. Therefore, the frame 55 is more useful for controlling the thickness of the insulating resin film 22.

Figure 4B:
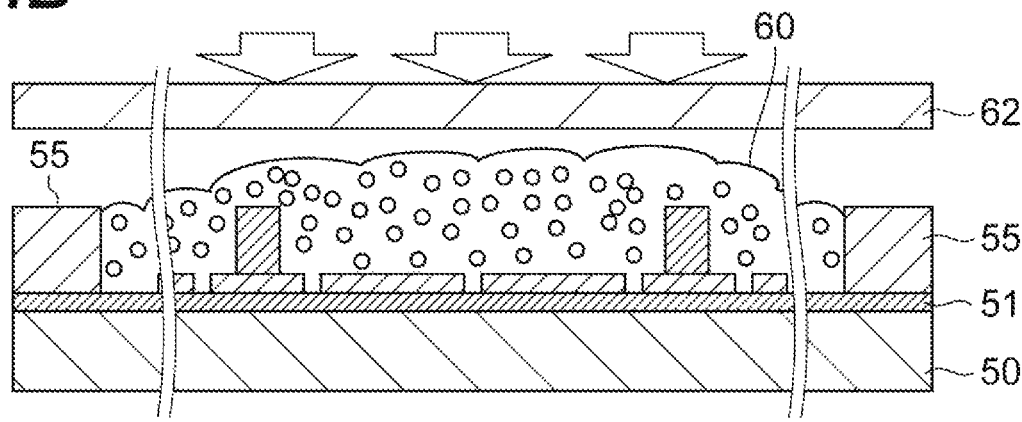

In the step illustrated in FIG. 4B, a resin powder 60 which will become the insulating resin film 22 is supplied to the inside of the frame 55 on the main surface 50a of the support plate 50, and a region surrounded by the frame 55 is covered with the resin powder 60. In this case, the first plated layer 53 and the second plated layer 54 formed on the main surface 50a are also covered with the resin powder 60. Two kinds of resin powders differ from each other in melting point are used as the resin powder 60. Then, the resin powder 60 is supplied to a portion on the main surface 50a of the support plate 50, a resin powder which will become the second layer 24 having a high melting point is supplied first, and a resin powder which will become the first layer 23 having a low melting point is supplied thereafter. As a result, the resin powder 60 supplied to a portion on the main surface 50a of the support plate 50 has a two-layer structure in which the resin powder having a high melting point is positioned on a lower side and the resin powder having a low melting point is positioned on an upper side. Then, the support plate 50 is subjected to hot pressing from the main surface 50a side using a hot plate 62 and is cooled thereafter.

Figure 4C:
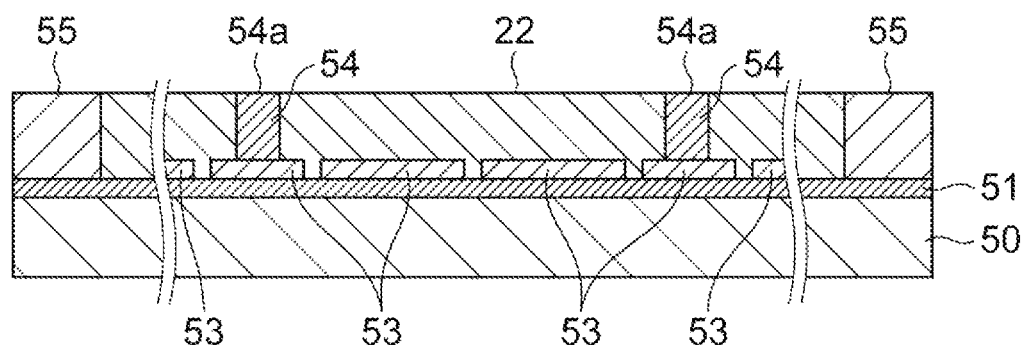

As a result, as illustrated in FIG. 4C, the main surface 50a of the support plate 50 is covered with the insulating resin film 22 inside the frame 55. In this case, the top surface 54a of the second plated layer 54 is exposed to the insulating resin film 22. When a resin film is formed on the top surface 54a of the second plated layer 54 after hot pressing, polishing processing such as CMP, grindstone polishing, or fly cutting may be performed in order to expose the top surface 54a of the second plated layer 54 to the insulating resin film 22.

Then, lastly, the support plate 50 is removed from the insulating resin film 22 together with the conducting film 51, thereby obtaining the wiring base body 20 illustrated in FIG. 2. A known technology of etching, or polishing processing such as CMP can be utilized to remove the conducting film 51 and the support plate 50.

A plurality of wiring base bodies 20 produced as described above are collectively stacked through thermal welding after connection portions 10 are respectively disposed at predetermined positions on the upper surface 20a of each of the wiring base bodies 20, thereby obtaining the printed wiring board 1 described above.

As described above, in the wiring base body 20 of the printed wiring board 1, the conductive post 30 including the wiring portion 32 and the wiring 40 are embedded in the insulating resin film 22. Therefore, even in a region in which the wiring portion 32 is formed, the wiring base body 20 is not increased in thickness. In addition, even in a region in which the wiring 40 is formed, the wiring base body 20 is not increased in thickness. Therefore, it is possible to obtain the printed wiring board 1 having high flatness by constituting the printed wiring board 1 by stacking a plurality of wiring base bodies 20.

Moreover, in the printed wiring board 1, when a plurality of wiring base bodies 20 are collectively stacked, the constituent material of the first layer 23 of the insulating resin film 22 has a low melting point, so that the first layer 23 is easily melted. Therefore, thermal welding on the upper surfaces 20*a* of the wiring base bodies 20 is reliably performed, and the wiring base bodies 20 are bonded to each other with high reliability.

In addition, the greater part of the conductive post 30 and the wiring 40 is embedded in the second layer 24 having a relatively high melting point and high structure strength at a high temperature. Therefore, even at a high temperature during collective stacking, positional misalignment between the conductive post 30 and the wiring 40 is unlikely to occur. As a result, separation between the conductive post 30 and the wiring 40, and deformation or strains in the conductive post 30 and the wiring 40 are curbed. During collective stacking, it can be performed at a stacking temperature within a range from a temperature near the melting point of the first layer 23 to the melting point of the second layer 24. In this case, high adhesion reliability and an effect of maintaining the shape of the wiring can be achieved. As an example, when the melting point of the first layer 23 is 280° C. and the melting point of the second layer 24 is 310° C., the stacking temperature can be within a range of 270° C. to 300° C.

The position of the boundary surface F between the first layer 23 and the second layer 24 in the insulating resin film 22 can be suitably changed. For example, as in a wiring base body 20A illustrated in FIG. 5, the position of the boundary surface F may be the height position at which the wiring portion 32 of the conductive post 30 and the main body portion 34 are joined to each other.

Figure 6:
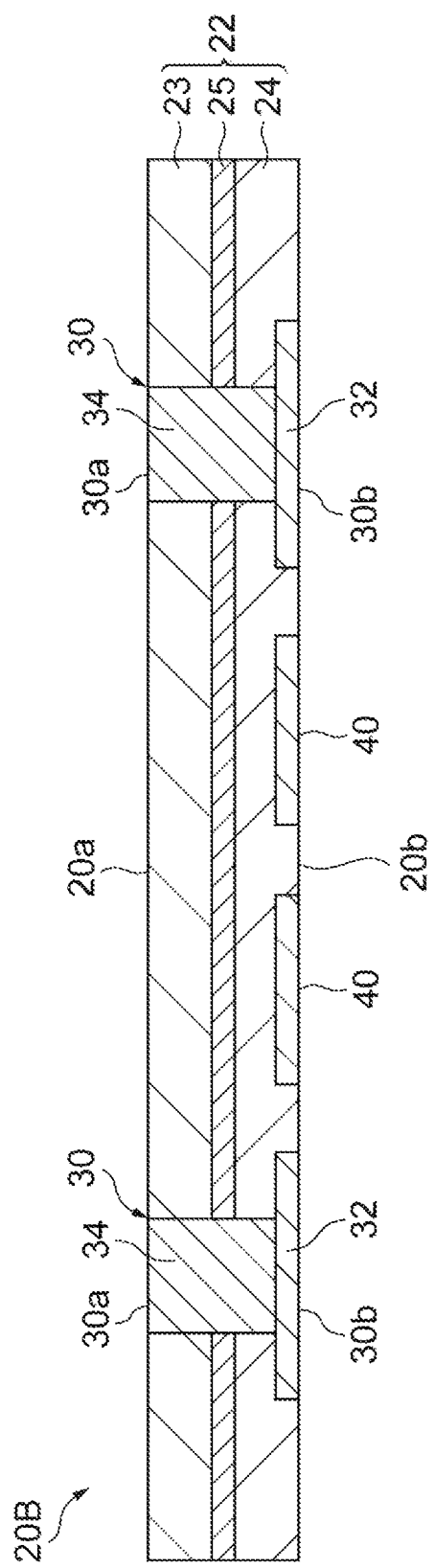
FIG. 6 is a schematic cross-sectional view illustrating a wiring base body in a different form.

In addition, the insulating resin film 22 may be constituted of three or more layers. For example, as in a wiring base body 20B illustrated in FIG. 6, a third layer 25 may be configured to be interposed between the first layer 23 and the second layer 24. The third layer 25 can be designed to be constituted of a constituent material having a melting point between the melting point of the constituent material of the first layer 23 and the melting point of the constituent material of the second layer 24. Alternatively, the third layer 25 can also be designed to be constituted of a constituent material having a melting point which gently changes (gradates) from the melting point of the constituent material of the first layer 23 to the melting point of the constituent material of the second layer 24. Such a third layer 25 can be formed by gradually reducing the supplying amount of the resin powder for the layer having a high melting point and gradually increasing the supplying amount of the resin powder for the layer having a low melting point, when the resin powder 60 is supplied to a portion on the main surface 50*a* of the support plate 50. According to the wiring base body 20B, a rapid change in melting point on the boundary surface F is curbed. Therefore, a sideslip or peeling on the boundary surface F can be curbed.

Figure 7:
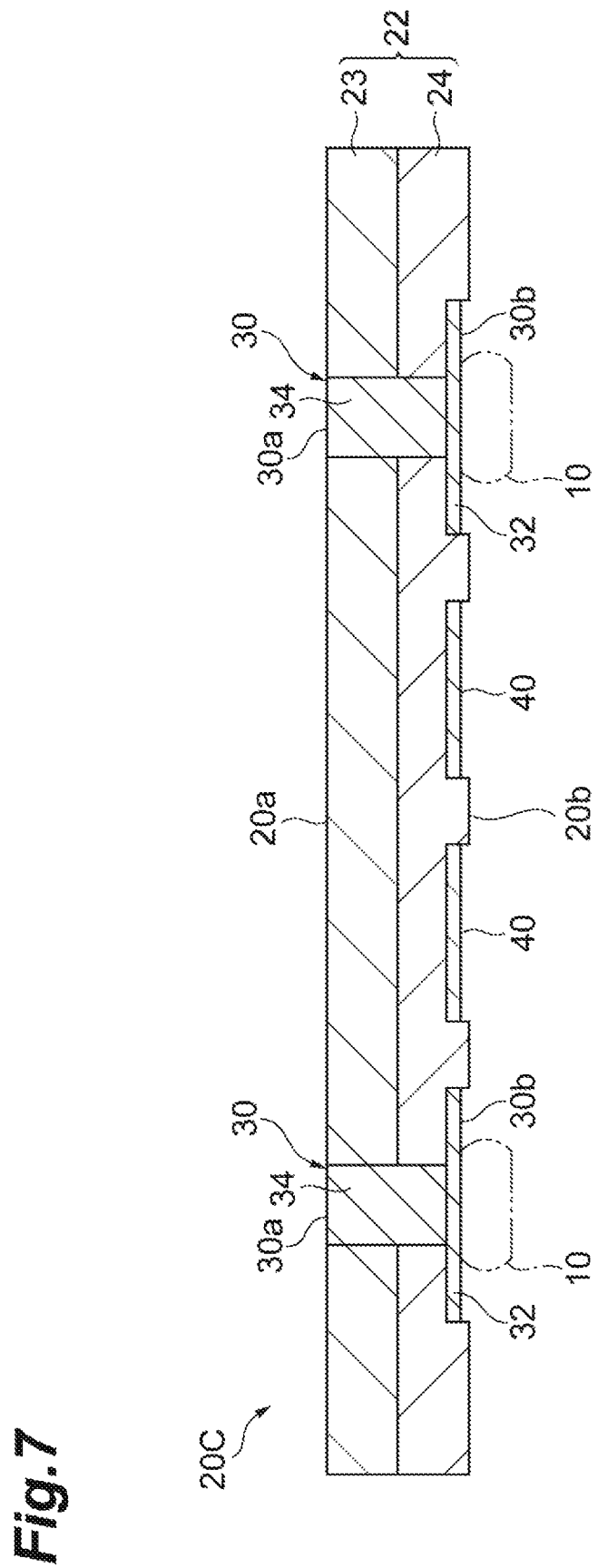
FIG. 7 is a schematic cross-sectional view illustrating a wiring base body in a different form.

The shape of the wiring base body 20 is not limited to that described above and can have a shape as illustrated in FIG. 7, for example. A wiring base body 20C illustrated in FIG. 7 differs from the wiring base body 20 described above in regard to only that the lower surface 30*b* of the conductive post 30 (that is, a lower end surface of the wiring portion 32) exposed to the lower surface 20*b* of the insulating resin film 22 is retracted from the lower surface 20*b*. For example, the configuration of the wiring base body 20C can be obtained by performing over-etching when the conducting film 51 and the support plate 50 are removed through etching after the step illustrated in FIG. 4C. In the case in which the lower surface 30*b* of the conductive post 30 is retracted from the lower surface 20*b* of the insulating resin film 22, when the plurality of wiring base bodies 20 are stacked with a connection portion 10 formed therebetween on the lower surface 30*b* of the conductive post 30, the connection portion 10 enters a part of the wiring portion 32 which is retracted from the lower surface 20*b*. As a result, an increase in thickness of a region, in which the connection portion 10 is formed, is curbed, so that the printed wiring board 1 can be further improved in flatness. The connection portion 10 can be formed of a solder, a conductive paste, or a metal nano filler, for example.

Hereinabove, the embodiment of the present disclosure has been described. The present disclosure is not limited to the foregoing embodiment, and various changes can be made. For example, the number of wiring base bodies constituting a printed wiring board is not limited to three layers and the number can be suitably increased and decreased. In addition, the constituent material for a wiring portion of a conductive post and the constituent material for a main body portion may be the same materials or may be different materials.

What is claimed is:
1. A printed wiring board comprising:
   a plurality of layers of a wiring base body, each of the plurality of layers including:
      an insulating resin film having a first main surface that is an uppermost surface of the insulating resin film and a second main surface that is a lowermost surface of the insulating resin film;
      a conductive post embedded in the insulating resin film that penetrates the insulating resin film from the first main surface to the second main surface; and
      a wiring (1) embedded in the insulating resin film, (2) extending in a direction parallel to the second main surface, and (3) exposed to the second main surface, wherein
   the insulating resin film has a multi-layer structure including a first layer with the first main surface and a second layer with the second main surface,
   the wiring being embedded in the second layer and not being embedded in the first layer,
   the first layer and the second layer are arranged alternately,
   a melting point of a constituent material of the first layer is lower than a melting point of a constituent material of the second layer,
   the conductive post has a wiring portion exposed to the second main surface and embedded in the second layer and a main body portion extending from the wiring portion to the first main surface through the second layer and the first layer,
   the main body portion has a monolithic composition,
   the wiring portion and the main body portion of the conductive post are constituted through plating,
   the plurality of layers includes a top layer of the plurality of layers and a bottom layer of the plurality of layers,
   the first layer and the second layer are alternately throughout the plurality of layers, including the top layer and the bottom layer, and
   the wiring and the wiring portion do not extend beyond the second main surface.

2. The printed wiring board according to claim 1, wherein both the first main surface and the second main surface of the insulating resin film are flat all over the insulating resin film.

3. The printed wiring board according to claim 1, wherein a cross-sectional shape of the main body portion of the conductive post is even in a thickness direction of the insulating resin film.

* * * * *